United States Patent
Liu et al.

(10) Patent No.: US 10,381,420 B2
(45) Date of Patent: Aug. 13, 2019

(54) TOUCH DISPLAY PANEL AND TOUCH DISPLAY APPARATUS

(71) Applicant: Shanghai Tianma Micro-Electronics Co., Ltd., Shanghai (CN)

(72) Inventors: Conghui Liu, Shanghai (CN); Heeyol Lee, Xiamen (CN); Lihua Wang, Shanghai (CN); Yu Cai, Shanghai (CN); Quanpeng Yu, Shanghai (CN); Yang Zeng, Shanghai (CN); Xingyao Zhou, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 148 days.

(21) Appl. No.: 15/660,604

(22) Filed: Jul. 26, 2017

(65) Prior Publication Data
US 2018/0226454 A1  Aug. 9, 2018

(30) Foreign Application Priority Data
Feb. 7, 2017  (CN) .......................... 2017 1 0066910

(51) Int. Cl.
*H01L 27/32* (2006.01)
*G06F 3/041* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ...... G06F 3/0412; G06F 3/0416; G06F 3/044; H01L 27/323; H01L 27/3246; H01L 27/3258; H01L 27/3262; H01L 51/5253
See application file for complete search history.

(56) References Cited

U.S. PATENT DOCUMENTS 8,242,688 B2 * 8/2012 Kwon ................... H01L 51/524
                                                    313/504
8,247,274 B2 * 8/2012 Lee ..................... H01L 51/5246
                                                    438/149

(Continued)

FOREIGN PATENT DOCUMENTS

CN        105742322 A      7/2016
CN        106057853 A      10/2016

OTHER PUBLICATIONS

Chinese Office Action for application No. 201710066910.3; reported on Mar. 25, 2019.

*Primary Examiner* — Carolyn R Edwards
(74) *Attorney, Agent, or Firm* — Miller, Matthias & Hull LLP

(57) ABSTRACT

A touch display panel is provided. The touch display panel includes: a substrate; a thin-film transistor array, an organic light-emitting unit and a thin-film encapsulation layer which are successively laminated on the substrate; and a touch electrode arranged at a side, which is facing away from the organic light-emitting unit, of the thin-film encapsulation layer. The touch display panel includes a display area and a non-display area surrounding the display area. The non-display area has a first dam surrounding the display area and a second dam surrounding the first dam; the non-display area includes a bonding area and border areas disposed at two sides of the bonding area; and at least in the bonding area, organic material fills a region between the first dam and the second dam and fills a region at a side close to the display area of the first dam.

26 Claims, 6 Drawing Sheets

(51) Int. Cl.
*G06F 3/044* (2006.01)
*H01L 51/52* (2006.01)

(52) U.S. Cl.
CPC ........ *G06F 3/0416* (2013.01); *H01L 27/3246* (2013.01); *H01L 27/3258* (2013.01); *H01L 27/3262* (2013.01); *H01L 51/5253* (2013.01); *G06F 2203/04102* (2013.01); *H01L 2251/5338* (2013.01)

(56) References Cited

U.S. PATENT DOCUMENTS

| | | | |
|---|---|---|---|
| 8,357,929 B2* | 1/2013 | Ryu | H01L 51/525 257/40 |
| 8,405,309 B2 | 3/2013 | Lee | |
| 2007/0172971 A1* | 7/2007 | Boroson | H01L 51/5246 438/26 |
| 2009/0009046 A1* | 1/2009 | Oh | H01L 51/5246 313/1 |
| 2012/0049728 A1* | 3/2012 | Lee | H01J 9/241 313/512 |
| 2017/0033312 A1* | 2/2017 | Kim | H01L 51/5253 |
| 2017/0149017 A1* | 5/2017 | Lee | H01L 51/5243 |
| 2017/0179428 A1* | 6/2017 | Li | H01L 51/5253 |
| 2018/0061899 A1* | 3/2018 | Oh | G06F 3/0412 |
| 2018/0124933 A1* | 5/2018 | Park | G09G 3/22 |
| 2018/0159074 A1* | 6/2018 | Kim | H01L 51/5253 |

* cited by examiner

TOUCH DISPLAY PANEL AND TOUCH DISPLAY APPARATUS

CROSS-REFERENCE TO RELATED APPLICATIONS

This application claims priority to a Chinese patent application No. 201710066910.3 filed on Feb. 7, 2017, the disclosure of which is incorporated herein by reference in its entirety.

TECHNICAL FIELD

The present disclosure relates to the display field, and in particular relates to a touch display panel and a touch display apparatus.

BACKGROUND

At present, in order to realize a touch function, a flexible display panel adopting an organic light emitting diode usually needs to be bonded with a layer of touch module. Therefore, the flexible display panel cannot be slim. An integration technology is used to substitute a traditional module lamination technology so as to achieve a slim flexible touch display panel. In a current integration technology, touch electrodes are mainly integrated in a protective film layer, a polarizer or a cover glass, or integrated in a thin-film encapsulation layer. The above manner can make the flexible display product thinner to a certain degree. However, since the touch electrodes are integrated in the display panel, wires of the touch electrodes may cross a border area of the display panel. As a result, the wires of the touch electrodes might break due to multiple climbing, causing bad touch and influencing the realization of the touch function of the touch display panel.

SUMMARY

In view of this, an aspect of embodiments of the present disclosure provides a touch display panel, including:
a substrate;
an array of thin-film transistors, an organic light-emitting unit and a thin-film encapsulation layer which are successively laminated on the substrate; and
a touch electrode, arranged at a side, which is facing away from the organic light-emitting unit, of the thin-film encapsulation layer;
the touch display panel includes a display area and a non-display area surrounding the display area, the non-display area has a first dam surrounding the display area and a second dam surrounding the first dam; and the non-display area comprises a bonding area and border areas disposed at two sides of the bonding area, and in the bonding area, an organic material fills at least a region between the first dam and the second dam and fills a region between the display area and the first dam.

In another aspect, an embodiment of the present disclosure provides a touch display apparatus including the above touch display panel.

In the touch display panel and the touch display apparatus provided by the present disclosure, the organic material fills the region between the first dam and the second dam in the bonding area and fills the region between the display area and the first dam, so that the breaking of a touch electrode lead when the touch electrode lead crosses an undulate dam area can be avoided. Moreover, the organic materials have good elasticity and can alleviate and protect the stress accumulation of the touch electrode lead when the display panel is bent. Therefore, the touch display panel provided by the present disclosure is more applicable to the flexible display.

BRIEF DESCRIPTION OF DRAWINGS

FIG. 1b is a sectional view along line A-A' in FIG. 1a;
FIG. 7b is a sectional view along line A-A in FIG. 7a.

DETAILED DESCRIPTION

Figure 1A:
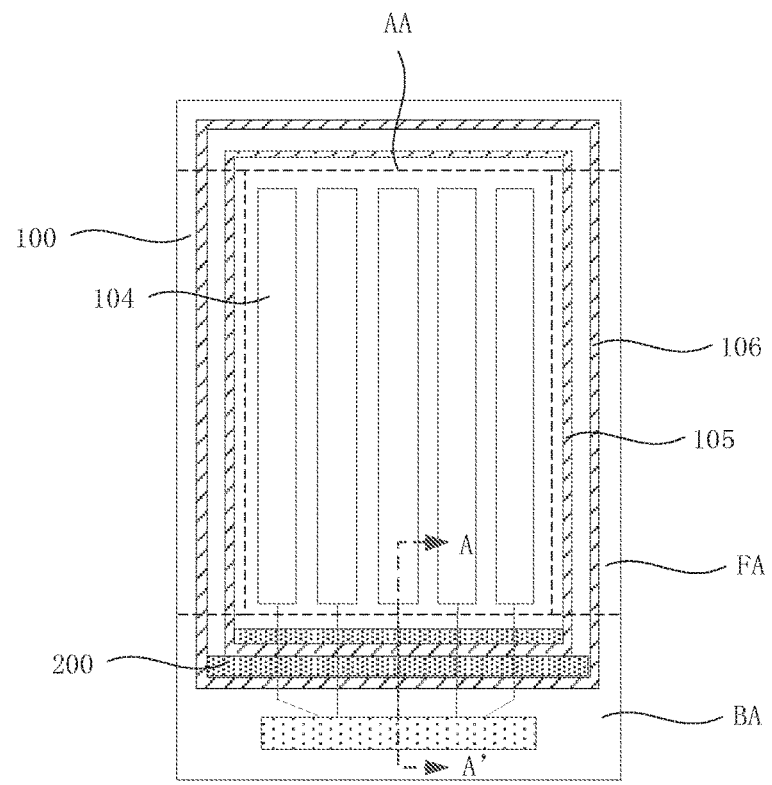
FIG. 1a is a schematic diagram illustrating a touch display panel provided by an embodiment of the present disclosure.

The present disclosure is further described below in combination with the drawings and embodiments. It may be understood that the specific embodiments described herein are only used to explain the present disclosure rather than limiting the present disclosure. In addition, it should be stated that in order to facilitate the description, only a part related to the present disclosure rather than the whole structure is illustrated in the drawings. In order to make the description clearer, same reference numerals are used in different drawings.

Figure 1B:
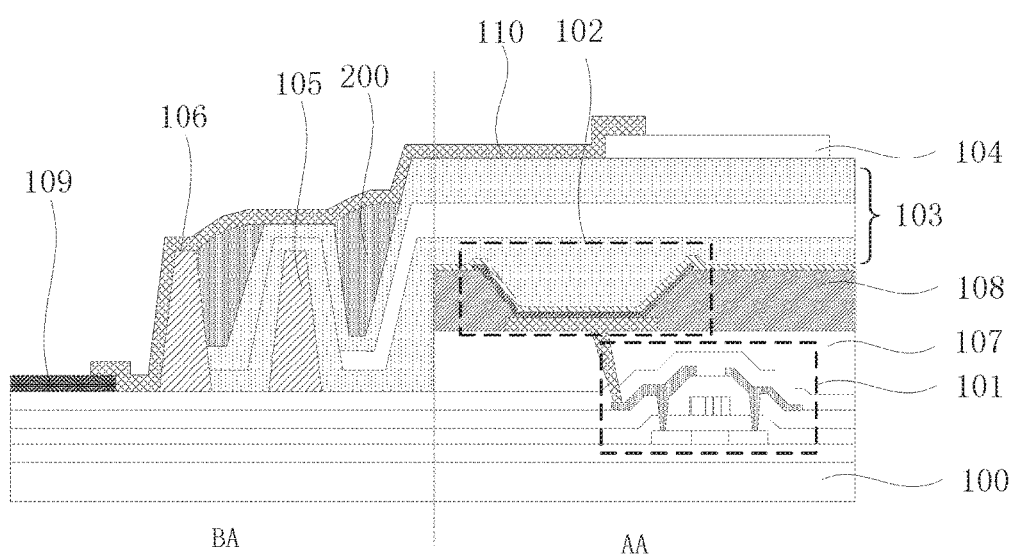

FIG. 1a is a schematic diagram illustrating a touch display panel provided by an embodiment of the present disclosure, and FIG. 1b is a sectional view along line A-A' in FIG. 1a. With reference to FIG. 1a and FIG. 1b, the touch display panel includes: a substrate 100; an array of thin-film transistors 101, an organic light-emitting unit 102 and a thin-film encapsulation layer 103 which are successively laminated on the substrate 100; and a touch electrode 104, arranged at a side, which is facing away from the organic light-emitting unit 102, of the thin-film encapsulation layer 103.

The touch display panel includes a display area AA and a non-display area surrounding the display area. The non-display area has a first dam 105 surrounding the display area AA and a second dam 106 surrounding the first dam 105.

The non-display area includes a bonding area BA and border areas FA disposed at two sides of the bonding area BA. At least in the bonding area BA, an organic material 200 fills a region between the first dam 105 and the second dam 106 and fills a region at a side close to the display area AA of the first dam 105.

The substrate 100 may be a substrate made of rigid materials, such as a glass substrate. If the substrate 100 is the glass substrate, then the touch display panel is a display panel of a fixed shape. The substrate 100 may be flexible, extensible, foldable, bendable or crimpable, so that the touch display panel may be flexible, extensible, foldable, bendable or crimpable. The substrate 100 may be made of any appropriate flexible insulation material. For example, the substrate may be made of polymer materials such as polyimide (PI), polycarbonate (PC), polyethersulfone (PES), polyethylene terephthalate (PET), polyethylene naphthalate (PEN), polyarylate (PAR) or glass fiber reinforced plastics (FRP) and the like, and the substrate 100 may be transparent, semi-transparent or opaque.

The array of thin-film transistors includes a plurality of thin-film transistors 101. Each thin-film transistor 101 includes a semiconductor active layer, a gate electrode, a source electrode and a drain electrode. The semiconductor active layer includes a source electrode area and a drain electrode area which are formed by doping N-type impurity ions or P-type impurity ions. An area between the source electrode area and the drain electrode area is a channel area where no impurity is doped.

The array of thin-film transistors is covered by a planarization layer 107 including an organic layer of acrylic, polyimide, or benzocyclobutene (BCB) and the like.

The organic light-emitting unit 102 is formed on the array of thin-film transistors. The organic light-emitting unit 102 includes an anode, a cathode and a light-emitting layer disposed between the anode and the cathode, and the anode is electrically connected with the drain electrode of the thin-film transistor.

A pixel defining layer (PDL) 108 is disposed on the planarization layer 107 so as to cover an edge of the anode. The PDL surrounding the edge of the anode is configured to define an emitting area of each sub-pixel. The PDL may be made of organic materials such as polyimide (PI), polyamide, benzocyclobutene (BCB), acrylic resin or phenolic resin and the like.

The light-emitting layer is disposed on the anode, and a part of the anode, on which the light-emitting layer is provided, is not covered by the PDL and is exposed. The light-emitting layer may be formed through a vapor deposition process, and is patterned to correspond to each sub-pixel, i.e. correspond to the patterned anode.

The light-emitting layer may be made of a low molecular weight organic material or a high molecular weight organic material. The light-emitting layer includes an organic emitting layer, and further includes at least one of a hole injection layer (HIL), a hole transport layer (HTL), an electron transport layer (ETL) and an electron injection layer (EIL). However, besides the organic emitting layer, the light-emitting layer may include other various functional layers.

The cathode is disposed on the light-emitting layer. Similar to the anode, the cathode may be formed as a transparent electrode or a reflecting electrode.

The light-emitting layer emits a visible light when a voltage is applied between the anode and the cathode, so that an image that can be recognized by a user can be realized.

The thin-film encapsulation layer 103 is disposed on the organic light-emitting unit 102 for protecting the light-emitting layer and other thin layers against the influence of external moisture, oxygen and the like. The thin-film encapsulation layer may include an inorganic layer and an organic layer. The inorganic layer and the organic layer are alternatively stacked. The organic layer of the thin-film encapsulation layer is usually formed in an ink-jet printing manner, the jet-printed ink droplets of organic materials are cured to form the encapsulation organic layer, so that the first dam 105 surrounding the display area needs to be arranged in the non-display area of the touch display panel. The first dam 105 is served as a cutoff area of the organic material, and the cutoff area described herein means that the first dam can be used as a barrier of the jet-printed ink droplets of organic materials, thereby defining a range for encapsulating the organic layers. The periphery of the first dam is provided with a second dam 106 surrounding the first dam 105, the inorganic layer of the thin-film encapsulation layer covers the first dam 105 and is ended at the second dam 106. Thus, the second dam 106 can prevent cracks generated by the edge inorganic layer from expanding into the display panel and causing the degradation of the encapsulation effect of the thin-film encapsulation layer.

The touch display panel further includes a protective film, a circular polarizer and other structures. The protective film is configured to further enhance the encapsulation effect of the thin-film encapsulation layer, and may be directly laminated with the thin-film encapsulation layer. The circular polarizer is directly affixed at a surface of the thin-film encapsulation layer or the protective film, and is configured to resist the reflection of ambient light.

In order to implement the integrated touch, the touch electrode 104 is arranged in the touch display panel, and may be directly integrated with the polarizer and the protective film of the touch display panel. That is, the touch electrode is directly formed on the polarizer or the protective film and then directly laminated with the thin-film encapsulation layer, or the touch electrode is formed on a single underlayer substrate and then laminated with the polarizer, the protective film or the thin-film encapsulation layer. Another touch structure is that the touch electrode is directly formed on the surface of the thin-film encapsulation layer. In order to input and output touch signals, the touch display panel further includes a touch electrode lead 110, an end of which is electrically connected with the touch electrode 104 and the other end of which is electrically connected with a flexible circuit board 109.

As described above, the touch display panel includes the display area and the non-display area surrounding the display area. The display area is configured to display images, receive and detect touching input. The non-display area includes the bonding area and the border areas disposed at two sides of the bonding area. Generally, the bonding area is provided with bonding pads. The touch electrode lead is bonded to the flexible circuit board via the bonding pads in the bonding area.

For any one of the above touch structures, when the touch electrode lead 110 electrically connected with the touch electrode is connected with the flexible circuit board 109 disposed in the bonding area BA, the touch electrode lead needs to cross the first dam 105 and the second dam 106. Since the first dam 105 and the second dam 106 per se have a certain height, the touch electrode lead 110 is easy to break when crossing the first dam 105 and the second dam 106, causing a bad touch.

According to an embodiment of the present disclosure, at least in the bonding area BA, the organic material 200 fills a region between the first dam 105 and the second dam 106, and fills a region at the side close to the display area AA of the first dam 105. The organic material 200 can fill or reduce a height difference between the first dam 105 and the second dam 106 and a height difference between the first dam 105 and the display area AA, so that the touch electrode lead can cross the first dam, the organic material and the second dam to be electrically connected with the flexible circuit board of the bonding area without climbing up and down when entering the bonding area BA from the display area AA. Therefore, the reliability of the touch electrode lead 110 is guaranteed. Moreover, since the inorganic layers of the thin-film encapsulation layer cover the first dam and are ended at the second dam, two inorganic layers covering the first dam directly contact with each other, thus stress accumulation exists, and cracks are easily generated and expand inwards. The organic materials filling the region between the first dam and the second dam and the region at the side, which is close to the display area, of the first dam can alleviate the stress accumulation of the inorganic layers and reduce the cracks of the inorganic layers and the expansion of the cracks, thereby improving the encapsulation effect of the touch display panel and improving the reliability of light-emitting devices.

Since the touch electrode according to the embodiment of the present disclosure is arranged at the side, which is facing away from the organic light-emitting unit, of the thin-film encapsulation layer, the flexible circuit board electrically connected with the touch electrode is generally arranged on the substrate directly, and the touch electrode and the flexible circuit board are different in heights. A height D2 of the second dam 106 is set to be less than a height D1 of the first dam 105 in an embodiment of the present disclosure. In such setting mode, the breaking of the touch electrode lead when entering the flexible circuit board from the second dam can be avoided.

Figure 2:
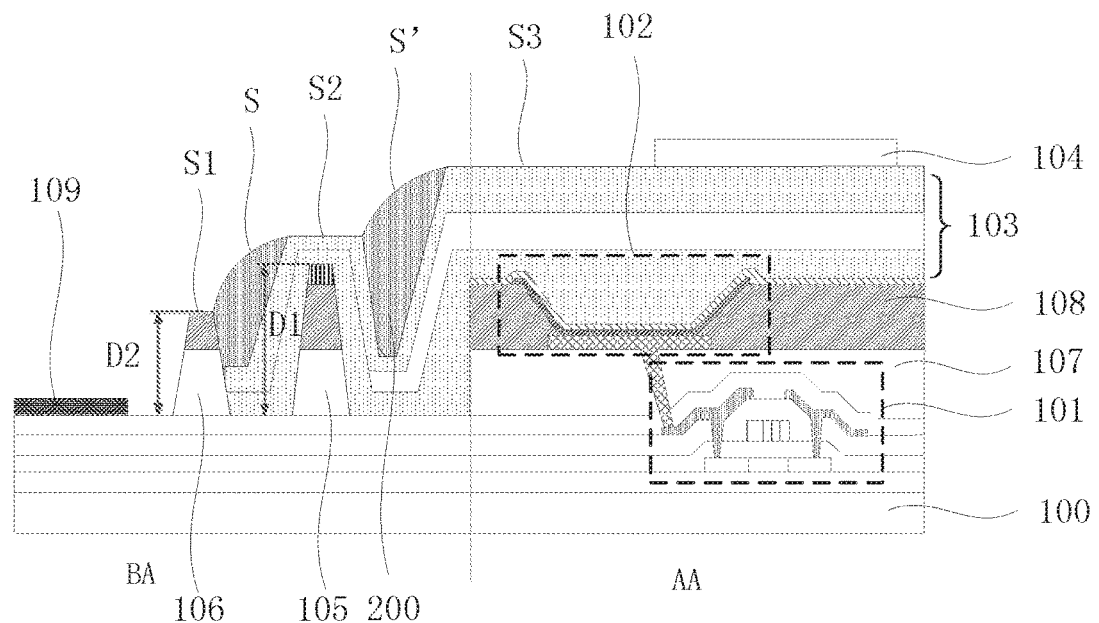
FIG. 2 is a schematic diagram illustrating another touch display panel provided by an embodiment of the present disclosure.

FIG. 2 is a schematic diagram illustrating another touch display panel provided by an embodiment of the present disclosure. Referring to FIG. 2, the first dam 105 and the second dam 106 may be formed by laminating the planarization layer 107, the pixel defining layer 108 and a supporting pillar arranged on the substrate. Optionally, the first dam 105 includes at least the planarization layer 107, the pixel defining layer 108 and the supporting pillar which are arranged in a laminating manner, the second dam 106 includes at least the planarization layer 107 and the pixel defining layer 108 which are arranged in a laminating manner. The first dam and the second dam are set to have different laminated structures, so that the height of the second dam is less than that of the first dam.

Optionally, the organic material 200 filling the region between the first dam 105 and the second dam 106 has a surface S at the side facing away from the substrate. The surface S is an arc surface or an oblique surface. One end of the arc surface or the oblique surface abuts a top surface S2, which is facing away from the substrate 100, of the first dam 105, and the other end of the arc surface or the oblique surface abuts a top surface S1, which is facing away from the substrate 100, of the second dam 106. FIG. 2 is a schematic diagram in which the top surface S is an arc surface. The height difference between the first dam and the second dam can be gently filled by setting the surface of the organic material at the side facing away from the substrate as the arc surface or the oblique surface, so that the touch electrode lead crossing the first dam and the second dam can smoothly transit without undulation. Therefore, the reliability of the touch electrode lead is guaranteed.

Figure 3:
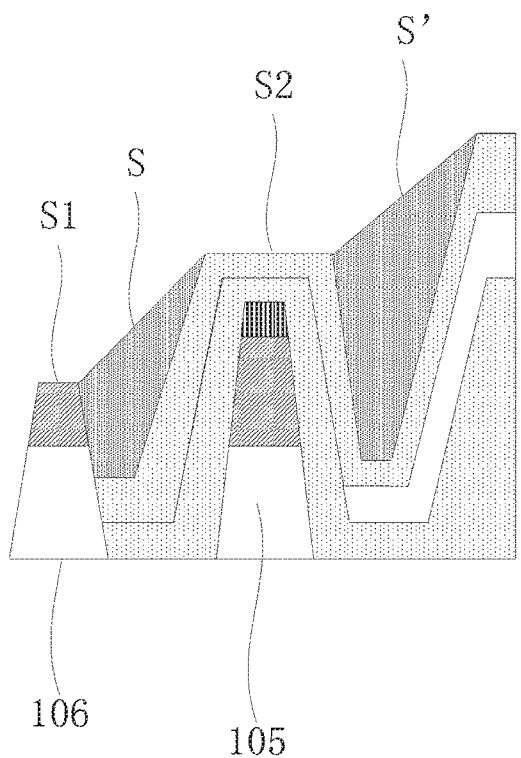
FIG. 3 is a local schematic diagram illustrating a touch display panel provided by an embodiment of the present disclosure.

Similarly, the organic material filling the region at the side close to the display area of the first dam has a surface S' at a side facing away from the substrate. The surface S' is an arc surface or an oblique surface. One end of the arc surface or the oblique surface abuts the top surface S2, which is facing away from the substrate 100, of the first dam 105, and the other end of the arc surface or the oblique surface abuts a top surface S3, which is facing away from the substrate, of the thin-film encapsulation layer 103. It should be noted that this embodiment of the present disclosure further includes a combination of the above two technical solutions, that is, the organic material filling the region between the first dam and the second dam and the organic material filling the region at the side close to the display area of the first dam both have an arc surface or both have an oblique surface at the side facing away from the substrate (both of S and S' have an arc surface or both of S and S' have an oblique surface). In this way, an entire path from the touch electrode of the display area to the flexible circuit board is a smooth arc surface or an oblique surface shape, and the stability of the touch electrode lead is maximally guaranteed, thereby guaranteeing the reliability of the touch function. FIG. 3 is a local schematic diagram illustrating a touch display panel provided by an embodiment of the present disclosure, in which both the surface S and the surface S' are oblique surfaces.

Figure 4:
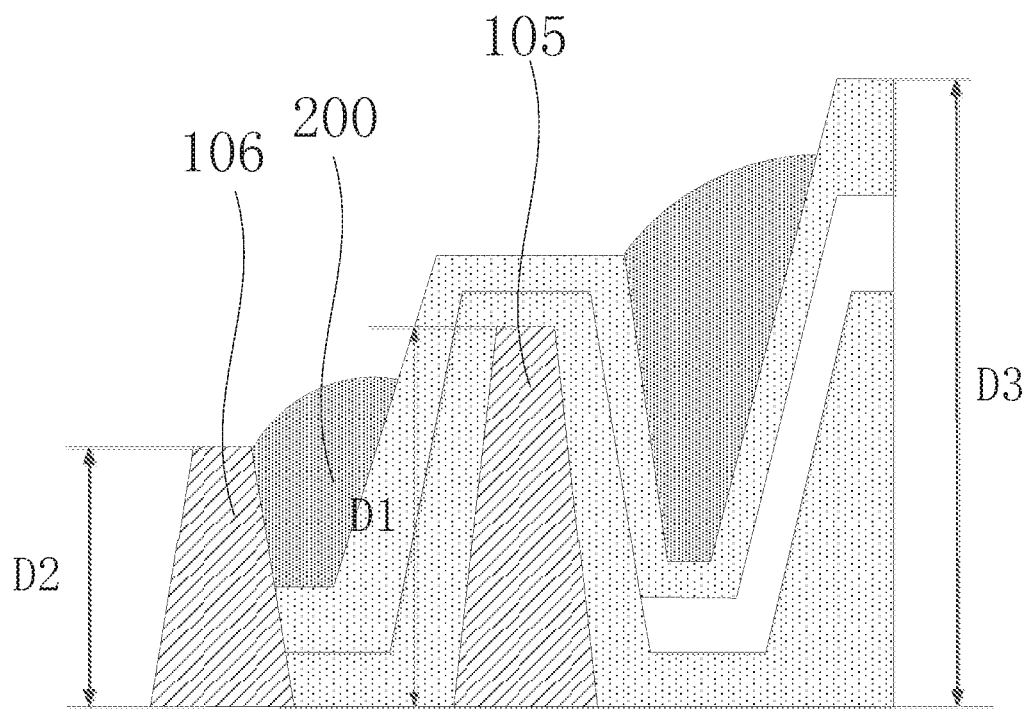
FIG. 4 is a local schematic diagram illustrating another touch display panel provided by an embodiment of the present disclosure.

FIG. 4 is a local schematic diagram illustrating another touch display panel provided by an embodiment of the present disclosure. As shown in FIG. 4, the height of the organic material filling the region between the first dam 105 and the second dam 106 is between the height of the first dam and the height of the second dam. The height of the organic material 200 herein may be equal to the height of the first dam, or may also be equal to the height of the second dam, and may also be an average value of the height of the first dam and the height of the second dam, so that the undulate state between the first dam and the second dam is changed to a stepped shape with a relatively small height difference. Therefore, the reliability of the touch electrode is guaranteed.

Similarly, the height of the organic material filling the region at the side close to the display area of the first dam is between the height of the first dam and the height of the thin-film encapsulation layer. It should be noted that the embodiment of the present disclosure further includes a combination of the above two technical solutions. That is, the height of the organic material 200 filling the region between the first dam 105 and the second dam 106 is between the height D1 of the first dam and the height D2 of the second dam, and meanwhile, the height of the organic material 200 filling the region at the side close to the display area of the first dam is between the height D1 of the first dam and the height D3 of the thin-film encapsulation layer. In this way, the entire path from the touch electrode of the display area to the flexible circuit board is a stepped shape with a relatively small height difference.

Figure 5:
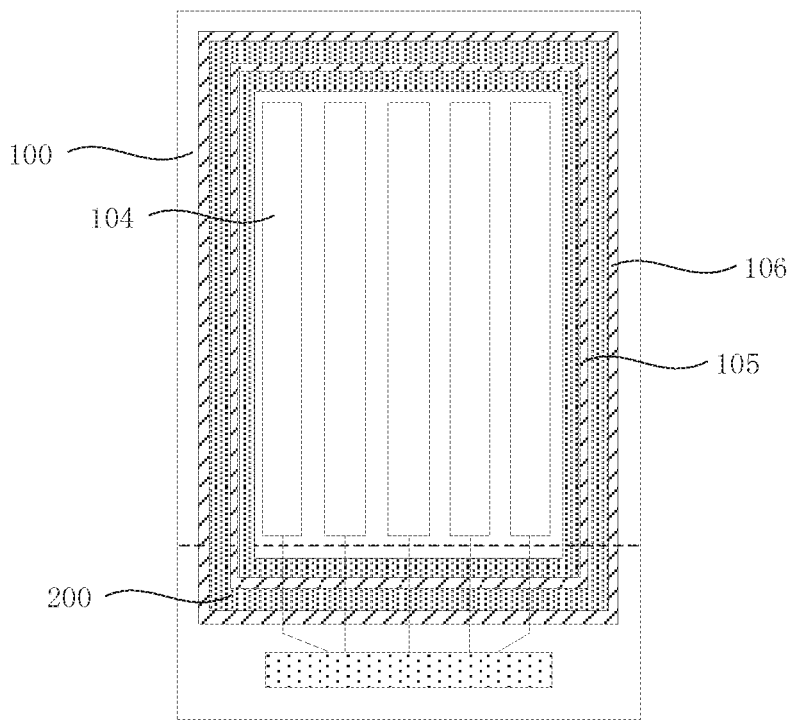
FIG. 5 is a schematic diagram illustrating another touch display panel provided by an embodiment of the present disclosure.

Optionally, FIG. 5 is a schematic diagram illustrating another touch display panel provided by an embodiment of the present disclosure. As shown in FIG. 5, in the entire non-display area, the organic materials fill a region between the first dam and the second dam and fill a region at the side close to the display area of the first dam. The organic materials filling the region between the first dam and the second dam and the organic materials filling the region between the first dam and the display area may be at least one of polytetrafluoroethylene, perfluoro alkoxyl alkane, perfluoro ethylene propylene copolymer, ethylene-tetrafluoroethylene copolymer, polyvinylidene fluoride, polychlorotrifluoroethylene, ethylene-trifluoroethylene copolymer, polytetrachloride ethylene-perfluoro-dioxolane copolymer and polyvinyl fluoride, or the organic materials may also be negative photoresist. Since the organic material has good ductility and elasticity, the filling organic materials on one hand ensure the connection reliability of the touch electrode lead, and on the other hand improve the bending resistance of the touch display panel, thereby facilitating the flexible application of the touch display panel.

Figure 6:
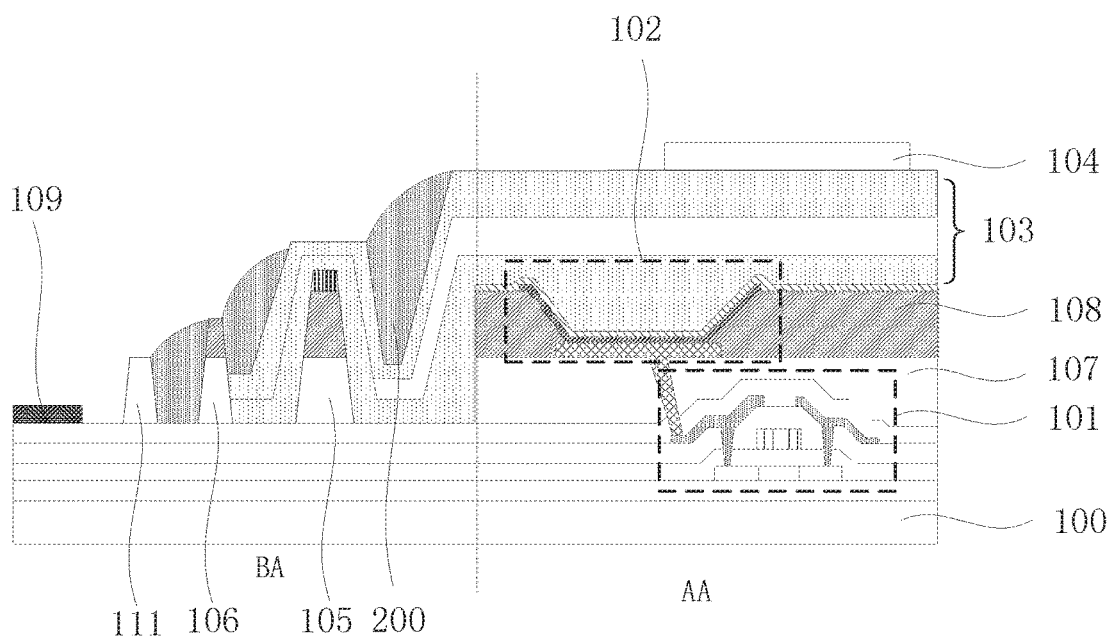
FIG. 6 is a schematic diagram illustrating another touch display panel provided by an embodiment of the present disclosure.

FIG. 6 is a schematic diagram illustrating another touch display panel provided by an embodiment of the present disclosure. Similarities between the structure of the embodiment corresponding to FIG. 6 and the structure of the foregoing embodiments are not described in detail herein and can refer to the aforementioned description, and the difference is mainly described herein. Specifically, as shown in FIG. 6, the touch display panel further includes a third dam 111. The third dam 111 surrounds the second dam 106, and the height of the third dam is less than that of the second dam 106. By arranging the third dam 111, the height difference between the second dam 106 and the flexible circuit board 109 can be further reduced, so that the breaking problem of the touch electrode lead 110 caused by the height difference is prevented between the second dam and the flexible circuit board. The third dam 111 can be used as a dam for blocking the expanding of cracks of the inorganic layers at the edge of the touch display panel, and can also be used to protect the film layer inside the touch display panel against cracks together with the second dam, thereby improving the encapsulation effect of the touch display panel, and guaranteeing the reliability of the light-emitting devices.

The organic material 200 can also fill a region between the second dam 106 and the third dam 111 to prevent the touch electrode lead 110 from breaking while climbing between the second dam and the third dam, and the surface shape of the organic material 200 is the same as that described in the above embodiments and is not repeated herein.

Optionally, the third dam may include at least one planarization layer 107, i.e. the third dam may be prepared in the same layer as that of the planarization layer as described in the above embodiments, and is not repeated herein.

The touch function in the present embodiment can be realized through mutual-capacitance-type touch. As for the mutual-capacitance-type touch, the touch electrode includes touch driving electrodes and touch sensing electrodes. The touch driving electrodes are input with touch drive signals successively, and the touch sensing electrodes output detection signals. The touch driving electrodes and the touch sensing electrodes form a capacitor. When the touch display panel is subjected to a touch, the coupling between the touch driving electrodes and the touch sensing electrodes near a touch point will be influenced, thereby changing the capacitance between the touch driving electrodes and the touch sensing electrodes. A method for detecting the position of the touch point is that the touch drive signals are successively input to the touch driving electrodes, and the touch sensing electrodes output the touch sensing signals at the same time, so that the capacitance values at all junction points of the touch driving electrodes and the touch sensing electrodes, i.e. the capacitance of a two-dimensional plane of the entire integrated touch display panel, can be obtained, and a coordinate of the touch point can be calculated according to the two-dimensional capacitance variation data of the touch display panel.

Figure 7A:
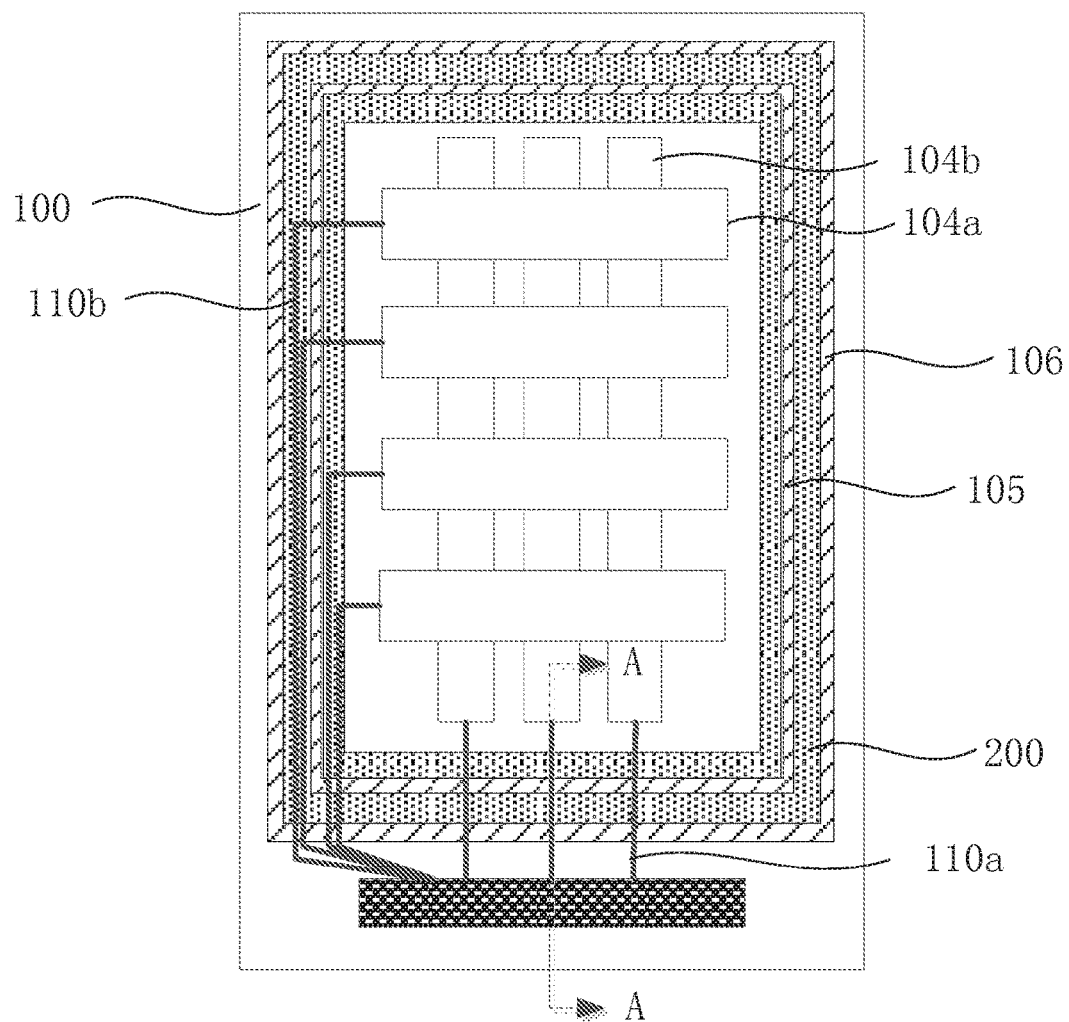
FIG. 7a is a schematic diagram illustrating another touch display panel provided by an embodiment of the present disclosure.
Figure 7B:
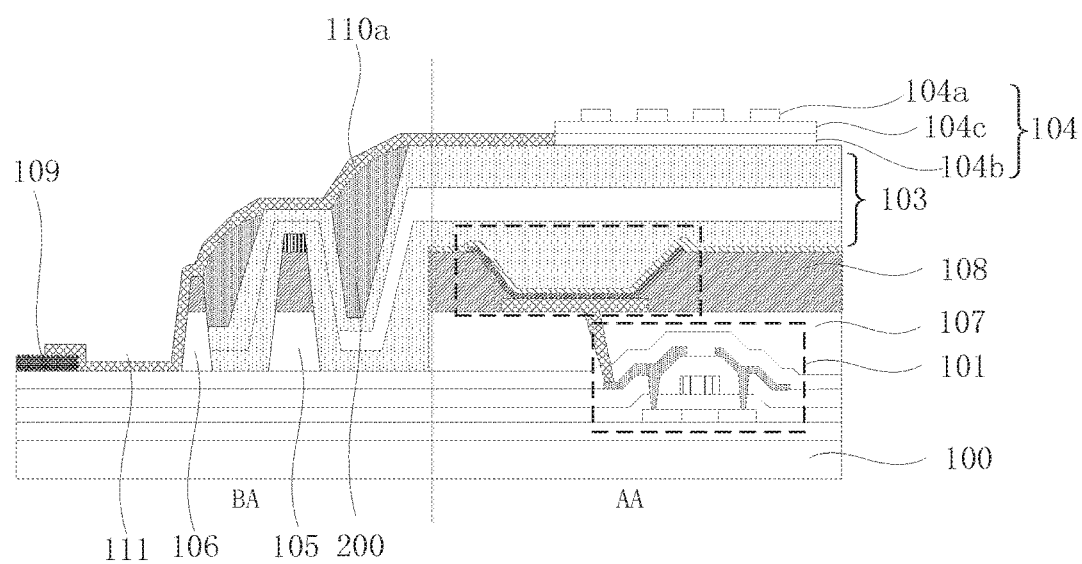

FIG. 7a is a schematic diagram illustrating a fifth touch display panel provided by an embodiment of the present disclosure, and FIG. 7b is a sectional view along line A-A of FIG. 7a. As shown in FIG. 7a and FIG. 7b, the touch electrode 104 includes a first electrode metal layer 104a, a second electrode metal layer 104b and an insulating layer 104c disposed between the first electrode metal layer 104a and the second electrode metal layer 104b. The first electrode metal layer 104a includes a plurality of touch driving electrodes which are arranged in an insulated manner, and the second electrode metal layer includes a plurality of touch sensing electrodes arranged in an insulated manner. Alternatively, the first electrode metal layer includes a plurality of touch driving electrodes which are arranged in an insulated manner and a plurality of touch sensing electrodes which are arranged in an insulated manner, and the second metal layer includes a plurality of bridging metals.

The touch electrode lead 110 includes touch driving leads 110a electrically connected with the touch driving electrodes and touch sensing leads 110b electrically connected with the touch sensing electrodes. It should be noted that the present disclosure is not limited to the mutual-capacitance-type touch, and can also be self-capacitance-type touch.

The first electrode metal layer/the second electrode metal layer may be disposed on the surface of the thin-film encapsulation layer, i.e. the first electrode metal layer/the second electrode metal layer is directly formed on the thin-film encapsulation layer, or an organic layer or an inorganic layer is provided between the first electrode metal layer/the second electrode metal layer and the thin-film encapsulation layer. The overall thickness of the touch display panel can be reduced by integrating the first electrode metal layer/the second electrode metal layer with the thin-film encapsulation layer, which facilitates the flexible application of the touch display panel.

In an embodiment of the present disclosure, the touch driving electrodes and the touch sensing electrodes are crosswise arranged along different directions, one of the touch driving leads 110a electrically connected with the touch driving electrodes and the touch sensing leads 110b electrically connected with the touch sensing electrodes enter into the flexible circuit board through the bonding area, and the other enter into the flexible circuit board through the border areas.

The touch electrode driving leads or the touch sensing leads crossing the border area are disposed between the first dam 105 and the second dam 106, or disposed at the side close to the display area of the first dam 105. Alternatively, the touch electrode driving leads or the touch sensing leads crossing the border area are simultaneously disposed between the first dam 105 and the second dam 106 and at the side close to the display area of the first dam 105.

The organic materials 200 fill a region between the first dam 105 and the second dam 106 and fill a region at the side close to the display area of the first dam 105, and the touch driving leads or the touch sensing leads are disposed on the surface of the organic materials 200, thus the organic materials 200 can disperse the stress concentrated on the touch electrode leads, so that the bending resistance of the touch driving leads or the touch sensing leads when the touch electrode lead is connected into the flexible circuit board can be improved.

An embodiment of the present disclosure further provides a touch display apparatus, including any one of the above touch display panels. The touch display apparatus may be a mobile phone, a desktop computer, a notebook computer, a tablet computer, an electronic photo album and the like. Since the touch display apparatus provided by the embodiment of the prevent disclosure includes the above-mentioned touch display panel, the touch display apparatus correspondingly has relevant advantages of the touch display panel. The region between the first dam and the second dam and the region at the side close to the display area of the first dam are filled with the organic materials, so that the connection stability of the touch electrode lead can be guaranteed.

What is claimed is:
1. A touch display panel, comprising:
a substrate;

an array of thin-film transistors, an organic light-emitting unit and a thin-film encapsulation layer which are successively laminated on the substrate; and a touch electrode, arranged at a side, which is facing away from the organic light-emitting unit, of the thin-film encapsulation layer;

wherein the touch display panel comprises a display area and a non-display area surrounding the display area, the non-display area has a first dam surrounding the display area and a second dam surrounding the first dam, wherein a height of the second dam is less than or equal to that of the first dam; and the non-display area comprises a bonding area and border areas disposed at two sides of the bonding area, and in the bonding area, an organic material fills at least a region between the first dam and the second dam and fills a region between the display area and the first dam;

wherein the organic material filling the region between the first dam and the second dam meets one of the followings:

the organic material filling the region between the first dam and the second dam has a surface which is an arc surface at a side facing away from the substrate of the organic material, one end of the arc surface abuts a top surface facing away from the substrate of the first dam, and the other end of the arc surface abuts a top surface facing away from the substrate of the second dam; and the organic material filling the region between the first dam and the second dam has a surface which is an oblique surface at a side facing away from the substrate of the organic material, one end of the oblique surface abuts the top surface facing away from the substrate of the first dam, and the other end of the oblique surface abuts the top surface facing away from the substrate of the second dam.

2. The touch display panel according to claim 1, wherein in the entire non-display area, the organic material fills a region between the first dam and the second dam and fills a region the display area and the first dam.

3. The touch display panel according to claim 1, further comprising a third dam, wherein the third dam surrounds the second dam and a height of the third dam is less than that of the second dam.

4. The touch display panel according to claim 3, wherein an organic material fills a region between the second dam and the third dam.

5. The touch display panel according to claim 3, further comprising a planarization layer disposed on the substrate, wherein the third dam comprises at least the planarization layer.

6. The touch display panel according to claim 1, further comprising a planarization layer, a pixel defining layer and a supporting pillar disposed on the substrate, wherein the first dam comprises at least the planarization layer, the pixel defining layer and the supporting pillar which are arranged in a laminated manner; and the second dam comprises at least the planarization layer and the pixel defining layer which are arranged in a laminated manner.

7. The touch display panel according to claim 1, wherein the organic material comprises at least one of polytetrafluoroethylene, perfluoro alkoxyl alkane, perfluoro ethylene propylene copolymer, ethylene-tetrafluoroethylene copolymer, polyvinylidene fluoride, polychlorotrifluoroethylene, ethylene-trifluoroethylene copolymer, polytetrachloride ethylene-perfluoro-dioxolane copolymer and polyvinyl fluoride.

8. The touch display panel according to claim 1, wherein the organic material comprises negative photoresist.

9. A touch display apparatus comprising the touch display panel of claim 1.

10. A touch display panel, comprising:

a substrate;

an array of thin-film transistors, an organic light-emitting unit and a thin-film encapsulation layer which are successively laminated on the substrate; and a touch electrode, arranged at a side, which is facing away from the organic light-emitting unit, of the thin-film encapsulation layer;

wherein the touch display panel comprises a display area and a non-display area surrounding the display area, the non-display area has a first dam surrounding the display area and a second dam surrounding the first dam, wherein a height of the second dam is less than or equal to that of the first dam;

wherein the non-display area comprises a bonding area and border areas disposed at two sides of the bonding area, and in the bonding area, an organic material fills at least a region between the first dam and the second dam and fills a region between the display area and the first dam;

wherein at least one of the followings is met:

a height of the organic material filling the region between the first dam and the second dam is between the height of the first dam and the height of the second dam; and a height of the organic material filling the region between the display area and the first dam is between the height of the first dam and a height of the thin-film encapsulation layer.

11. The touch display panel according to claim 10, wherein in the entire non-display area, the organic material fills a region between the first dam and the second dam and fills a region the display area and the first dam.

12. The touch display panel according to claim 10, further comprising a third dam, wherein the third dam surrounds the second dam and a height of the third dam is less than that of the second dam.

13. The touch display panel according to claim 12, wherein an organic material fills a region between the second dam and the third dam.

14. The touch display panel according to claim 12, further comprising a planarization layer disposed on the substrate, wherein the third dam comprises at least the planarization layer.

15. The touch display panel according to claim 10, further comprising a planarization layer, a pixel defining layer and a supporting pillar disposed on the substrate, wherein the first dam comprises at least the planarization layer, the pixel defining layer and the supporting pillar which are arranged in a laminated manner; and the second dam comprises at least the planarization layer and the pixel defining layer which are arranged in a laminated manner.

16. A touch display apparatus comprising the touch display panel of claim 10.

17. A touch display panel, comprising:

a substrate;

an array of thin-film transistors, an organic light-emitting unit and a thin-film encapsulation layer which are successively laminated on the substrate; and a touch electrode, arranged at a side, which is facing away from the organic light-emitting unit, of the thin-film encapsulation layer;

wherein the touch display panel comprises a display area and a non-display area surrounding the display area, the non-display area has a first dam surrounding the display area and a second dam surrounding the first dam, wherein a height of the second dam is less than or equal to that of the first dam;

wherein the non-display area comprises a bonding area and border areas disposed at two sides of the bonding area, and in the bonding area, an organic material fills at least a region between the first dam and the second dam and fills a region between the display area and the first dam;

wherein the organic material filling the region between the display area and the first dam meets one of the followings:

the organic material filling the region between the display area and the first dam has a surface which is an arc surface at a side facing away from the substrate of the organic material, one end of the arc surface abuts a top surface facing away from the substrate of the first dam, and the other end of the arc surface abuts a top surface facing away from the substrate of the thin-film encapsulation layer; and the organic material filling the region between the display area and the first dam has a surface which is an oblique surface at a side facing away from the substrate of the organic material, one end of the oblique surface abuts the top surface facing away from the substrate of the first dam, and the other end of the oblique surface abuts the top surface facing away from the substrate of the thin-film encapsulation layer.

18. The touch display panel according to claim 17, wherein in the entire non-display area, the organic material fills a region between the first dam and the second dam and fills a region the display area and the first dam.

19. The touch display panel according to claim 17, further comprising a third dam, wherein the third dam surrounds the second dam and a height of the third dam is less than that of the second dam.

20. The touch display panel according to claim 19, wherein an organic material fills a region between the second dam and the third dam.

21. The touch display panel according to claim 19, further comprising a planarization layer disposed on the substrate, wherein the third dam comprises at least the planarization layer.

22. The touch display panel according to claim 17, further comprising a planarization layer, a pixel defining layer and a supporting pillar disposed on the substrate, wherein the first dam comprises at least the planarization layer, the pixel defining layer and the supporting pillar which are arranged in a laminated manner; and the second dam comprises at least the planarization layer and the pixel defining layer which are arranged in a laminated manner.

23. A touch display apparatus comprising the touch display panel of claim 17.

24. A touch display panel, comprising:

a substrate;

an array of thin-film transistors, an organic light-emitting unit and a thin-film encapsulation layer which are successively laminated on the substrate; and a touch electrode, arranged at a side, which is facing away from the organic light-emitting unit, of the thin-film encapsulation layer;

wherein the touch display panel comprises a display area and a non-display area surrounding the display area, the non-display area has a first dam surrounding the display area and a second dam surrounding the first dam;

wherein the non-display area comprises a bonding area and border areas disposed at two sides of the bonding area, and in the bonding area, an organic material fills at least a region between the first dam and the second dam and fills a region between the display area and the first dam;

wherein the touch display panel further comprises a touch electrode lead, wherein one end of the touch electrode lead is electrically connected with the touch electrode, and the other end of the touch electrode lead is electrically connected with a flexible circuit board disposed in the bonding area after crossing the first dam, the organic material and the second dam, and the touch electrode comprises touch driving electrodes and touch sensing electrodes, and the electrode lead comprises touch driving leads and touch sensing leads, the touch driving leads are electrically connected with the touch driving electrodes, and the touch sensing leads are electrically connected with the touch sensing electrodes, wherein one of the touch driving leads and the touch sensing leads are connected into the flexible circuit board after crossing the bonding area, and the other one of the touch driving leads and the touch sensing leads are connected into the flexible circuit board after crossing the border areas;

wherein the one of the touch driving leads and the touch sensing leads that crossed the border areas are disposed between the first dam and the second dam, and/or disposed at the side close to the display area of the first dam.

25. The touch display panel according to claim 24, wherein the touch electrode is disposed on a surface of the thin-film encapsulation layer.

26. A touch display apparatus comprising the touch display panel of claim 24.

* * * * *